(12) United States Patent
Kim et al.

(10) Patent No.: US 9,768,053 B2
(45) Date of Patent: Sep. 19, 2017

(54) ACTIVE STRUCTURES OF A SEMICONDUCTOR DEVICE AND METHODS OF MANUFACTURING THE SAME

(71) Applicant: SAMSUNG ELECTRONICS CO., LTD., Suwon-si, Gyeonggi-do (KR)

(72) Inventors: Dae-Won Kim, Seoul (KR); Jae-Kyu Lee, Seongnam-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/955,193

(22) Filed: Dec. 1, 2015

(65) Prior Publication Data

US 2016/0163543 A1    Jun. 9, 2016

(30) Foreign Application Priority Data

Dec. 4, 2014  (KR) .................. 10-2014-0172854

(51) Int. Cl.
*H01L 27/24* (2006.01)
*H01L 45/00* (2006.01)
(Continued)

(52) U.S. Cl.
CPC ........ *H01L 21/762* (2013.01); *H01L 21/3083* (2013.01); *H01L 27/10814* (2013.01);
(Continued)

(58) Field of Classification Search
CPC ............... H01L 21/762; H01L 21/3083; H01L 27/10814; H01L 27/10817;
(Continued)

(56) References Cited

U.S. PATENT DOCUMENTS

| 5,256,588 A | * | 10/1993 | Witek | ............... H01L 27/10841 257/E21.652 |
| 5,497,017 A | * | 3/1996 | Gonzales | .......... H01L 27/10823 257/302 |

(Continued)

FOREIGN PATENT DOCUMENTS

| KR | 1998-0083840 A | 12/1998 |
| KR | 10-2000-0073114 A | 12/2000 |

(Continued)

*Primary Examiner* — Benjamin Sandvik
*Assistant Examiner* — Gustavo Ramallo
(74) *Attorney, Agent, or Firm* — Lee & Morse, P.C.

(57) ABSTRACT

A method of forming patterns of a semiconductor device, including partially etching an upper portion of a substrate to form first preliminary active patterns and a first trench, each of the first preliminary active patterns having a first width, and the first trench having a second width of about 2 to 3 times the first width; forming an insulating spacer on each sidewall of the first trench to form a second trench having the first width; forming a second preliminary active pattern in the second trench, the second preliminary active pattern having the first width; partially etching the first and second preliminary active patterns to form a plurality of first active patterns and a plurality of second active patterns and an opening between the plurality of first and second active patterns; and forming an insulation pattern to fill the opening.

17 Claims, 14 Drawing Sheets

(51) Int. Cl.
   H01L 21/762     (2006.01)
   H01L 21/308     (2006.01)
   H01L 27/108     (2006.01)
(52) U.S. Cl.
   CPC .. H01L 27/10817 (2013.01); H01L 27/10823 (2013.01); H01L 27/2436 (2013.01); H01L 27/2463 (2013.01); H01L 45/06 (2013.01); H01L 45/1233 (2013.01); H01L 45/144 (2013.01)
(58) Field of Classification Search
   CPC ........... H01L 27/10823; H01L 27/2436; H01L 27/2463; H01L 45/06; H01L 45/1233; H01L 45/144
   See application file for complete search history.

(56) References Cited

U.S. PATENT DOCUMENTS

| | | | | |
|---|---|---|---|---|
| 5,827,766 A | * | 10/1998 | Lou | H01L 27/10817 257/E21.012 |
| 6,137,128 A | * | 10/2000 | Holmes | H01L 29/945 257/296 |
| 6,482,717 B1 | | 11/2002 | Hahn | |
| 6,483,143 B2 | * | 11/2002 | Matsui | H01L 21/28562 257/306 |
| 7,534,704 B2 | * | 5/2009 | Ha | H01L 21/02381 257/E21.562 |
| 7,582,554 B2 | * | 9/2009 | Moriwaki | H01L 21/76897 257/E21.433 |
| 8,779,423 B2 | | 7/2014 | Liu et al. | |
| 2007/0170542 A1 | * | 7/2007 | Derderian | H01L 21/76224 257/510 |
| 2008/0315174 A1 | * | 12/2008 | Kang | H01L 27/115 257/4 |

FOREIGN PATENT DOCUMENTS

| | | |
|---|---|---|
| KR | 10-2002-0002640 A | 1/2002 |
| KR | 10-2007-0032474 A | 3/2007 |
| KR | 10-2008-0109151 A | 12/2008 |
| KR | 10-2009-0006661 A | 1/2009 |

* cited by examiner

ACTIVE STRUCTURES OF A SEMICONDUCTOR DEVICE AND METHODS OF MANUFACTURING THE SAME

CROSS-REFERENCE TO RELATED APPLICATION

Korean Patent Application No. 10-2014-0172854, filed on Dec. 4, 2014, in the Korean Intellectual Property Office, and entitled: "Active Structures of a Semiconductor Device and Methods of Manufacturing the Same," is incorporated by reference herein in its entirety.

BACKGROUND

1. Field

Example embodiments relate to active structures of a semiconductor device and methods of manufacturing the same.

2. Description of the Related Art

When semiconductor devices become more highly integrated, widths of active patterns and distances therebetween in a semiconductor device may be reduced.

SUMMARY

Embodiments may be realized by providing a method of forming patterns of a semiconductor device, including partially etching an upper portion of a substrate to form first preliminary active patterns and a first trench, each of the first preliminary active patterns extending in a first direction and having a first width, and the first trench being formed between the first preliminary active patterns and having a second width of about 2 times to about 3 times the first width; forming an insulating spacer on each sidewall of the first trench to form a second trench having the first width; performing a selective epitaxial growth (SEG) process using a portion of the substrate exposed by the second trench as a seed to form a second preliminary active pattern in the second trench, the second preliminary active pattern having the first width; partially etching the first and second preliminary active patterns to form a plurality of first active patterns and a plurality of second active patterns, respectively, and an opening between the plurality of first active patterns and the plurality of second active patterns; and forming an insulation pattern to fill the opening.

The method may further include forming a hard mask as an etching mask for forming the first trench on the substrate.

The hard mask may include a substantially same insulation material as that of the insulating spacers.

The hard mask and the insulating spacers may include silicon oxide.

The method may further include, after forming the second preliminary active pattern, removing upper portions of the insulating spacers and the hard mask above a top surface of the first preliminary active patterns.

Removing the upper portions of the insulating spacers and the hard mask may include a wet etch process.

The second preliminary active pattern may have a top surface substantially coplanar with that of the first preliminary active patterns.

The first width may be greater than a minimum size of a pattern formed by a photolithography process.

Forming the insulating spacer on each sidewall of the first trench to form the second trench may include forming an insulating spacer layer on each sidewall of the first trench by an atomic layer deposition (ALD) process to form the second trench; and anisotropically etching the insulating spacer layer.

The opening may extend in a direction different from the first direction.

Partially etching the first and second preliminary active patterns to form the plurality of first active patterns and the plurality of second active patterns, respectively, and the opening may include forming a plurality of openings isolated from each other.

The second preliminary active pattern may include a substantially same semiconductor material as that of the first preliminary active patterns.

Embodiments may be realized by providing an active structure of a semiconductor device, the active structure including a plurality of first active patterns and a plurality of second active patterns alternately and repeatedly arranged; each of the first active patterns protruding from a substrate, extending in a first direction, and including a substantially same material substantially as that of the substrate; each of the second active patterns protruding from the substrate, extending in the first direction, and including a semiconductor material formed by an epitaxial growth process; and an isolation layer pattern structure between the plurality of first active patterns and the plurality of second active patterns.

Each of the first and second active patterns may have a first width in a direction substantially perpendicular to the first direction, and a minimum width of the isolation layer pattern structure may be about 0.5 times to about 1 time of the first width.

The first width may be greater than a minimum size of a pattern formed by a photolithography process.

Embodiments may be realized by providing a method of forming patterns of a semiconductor device, including forming first preliminary active patterns and a first trench, each of the first preliminary active patterns extending in a first direction, and the first trench being formed between the first preliminary active patterns; forming an insulating spacer on each sidewall of the first trench to form a second trench; forming a second preliminary active pattern in the second trench; forming first active patterns and second active patterns, respectively, and an opening between the first active patterns and the second active patterns, each of the first and second active patterns having a first width greater than a minimum size of a pattern formed by a photolithography process, and each of the insulating spacers having a width smaller than the first width; and forming an insulation pattern to fill the opening.

The method may further include forming a hard mask as an etching mask for forming the first trench.

The method may further include, after forming the second preliminary active pattern, removing upper portions of the insulating spacers and the hard mask above a top surface of the first preliminary active patterns. Removing the upper portions of the insulating spacers and the hard mask may include a wet etch process.

Each of the insulating spacers may have a width of about 0.5 times to less than 1 time the first width.

Each of the first and second preliminary active patterns may have an aspect ratio of about 10:1 to about 30:1.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
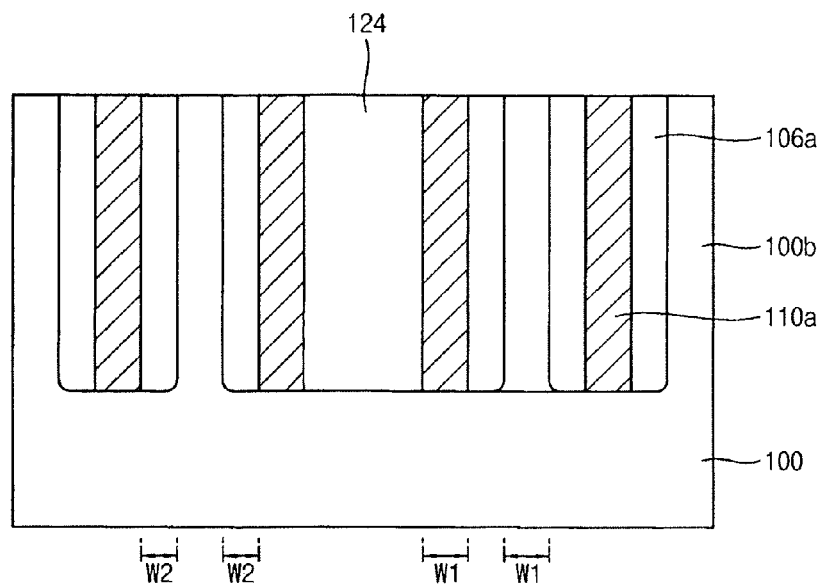
FIGS. 1 and 2 illustrate a cross-sectional view and a plan view, respectively, of an active structure of a semiconductor device in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the sizes and relative sizes of layers and regions may be exaggerated for clarity. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to be limiting.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
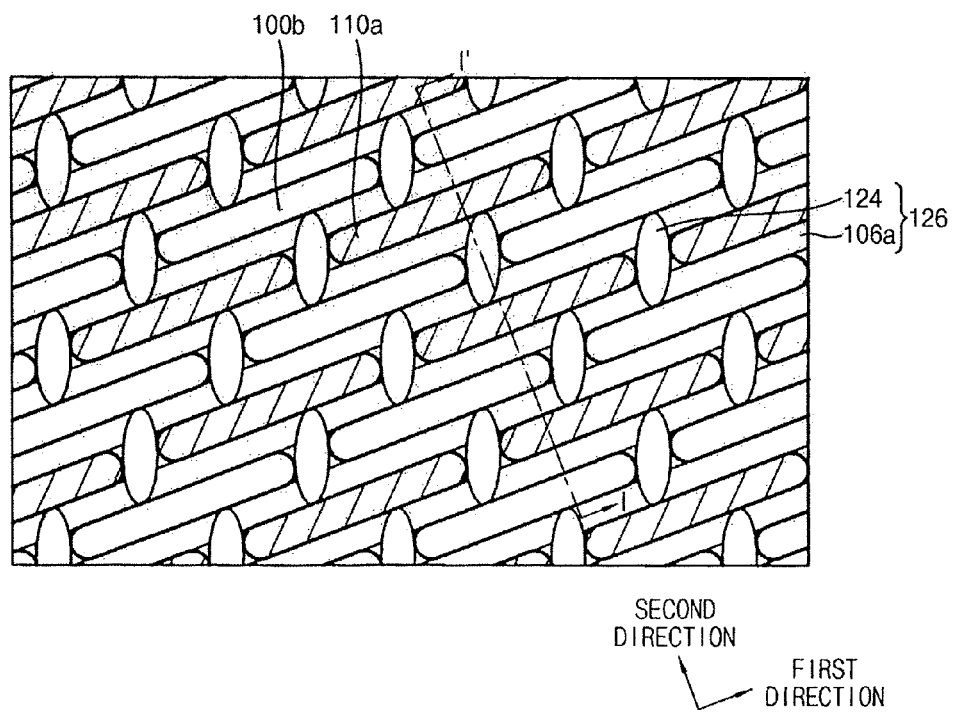

FIGS. 1 and 2 illustrate a cross-sectional view and a plan view, respectively, of an active structure of a semiconductor device in accordance with example embodiments.

Referring to FIGS. 1 and 2, the active structure of the semiconductor device may include first and second active patterns 100b and 110a protruding from a top surface of a substrate 100, and an isolation layer pattern structure 126 between the first and second active patterns 100b and 110a.

The substrate 100 may be a semiconductor substrate, e.g., a silicon substrate, a germanium substrate, a silicon-germanium substrate, a silicon-on-insulator (SOI) substrate, or a germanium-on-insulator (GOD) substrate.

The first active pattern 100b may extend in a first direction. In example embodiments, the first direction may be neither parallel nor perpendicular to a flat zone or a notch of the substrate 100. In example embodiments, the first direction may be parallel or perpendicular to the flat zone or the notch of the substrate 100.

In example embodiments, a plurality of first active patterns 100b having an island shape from each other may be arranged in the first direction. The first active patterns 100b may be formed by partially etching upper portions of an initial substrate, so that the substrate 100 and the first active patterns 100b may include substantially the same material.

The second active pattern 110a may extend in the first direction. In example embodiments, a plurality of second active patterns 110a having an island shape from each other may be arranged in the first direction. The second active patterns 110a may include a semiconductor material formed by an epitaxial growth process. In example embodiments, the second active patterns 110a may include a semiconductor material substantially the same as that of the first active patterns 100b, which may be, e.g., single crystalline silicon.

The first and second active patterns 100b and 110a may be alternately and repeatedly arranged in a second direction substantially perpendicular to the first direction. In example embodiments, the first active patterns 100b may be arranged in odd-numbered rows, and the second active patterns 110a may be arranged in even-numbered rows.

Each of the first and second active patterns 100b and 110a may have a first width W1 in the second direction. The first width W1 may be greater than a minimum size of a pattern that may be formed by a photolithography process. According as the first width W1 of the first and second active patterns 100b and 110a increases, an active region of the semiconductor device may increase.

The isolation layer pattern structure 126 may include an oxide, e.g., silicon oxide. The isolation layer pattern structure 126 may include an insulating spacer 106a on sidewalls of the first and second active patterns 100b and 110a in the second direction, and an insulation pattern 124, which may be formed at a first area between neighboring first active patterns 100b in the first direction and a second area between neighboring second active patterns 110a in the first direction. In example embodiments, the insulation pattern 124 may have a pillar shape.

The insulating spacer 106a may have a second width W2 in the second direction. The second width W2 may be about 0.5 times to about 1 time of the first width W1, and a minimum width of the isolation layer pattern structure 126 between the first and second active patterns 100b and 110a may be substantially the same as the second width W2.

In example embodiments, each of the first and second active patterns 100b and 110a may have an aspect ratio of about 10:1 to about 30:1. Even though the aspect ratio of each of the first and second active patterns 100b and 110a may increase and a space between the first and second active patterns may decrease, the first and second active patterns 100b and 110a may be electrically isolated by the isolation layer pattern structure 126.

The active structure may include the first active pattern 100b formed from the initial substrate and the second active pattern 110a formed by the epitaxial growth process, and the first and second active patterns 100b and 110a may be alternately and repeatedly arranged in the second direction. The isolation layer pattern structure 126 may be formed on sidewalls of the first and second active patterns 100b and 110a to have a spacer shape, and generation of voids or seams may be reduced in the isolation layer pattern structure 126.

The semiconductor device on the active structure may have a high reliability.

FIGS. 3 to 14 illustrate plan views and cross-sectional views of stages of a method of forming the active structure of the semiconductor device in FIGS. 1 and 2 in accordance with example embodiments. For example, FIGS. 4, 6, 8, 10, 12 and 14 illustrate plan views, and FIGS. 3, 5, 7, 9, 11 and 13 illustrate cross-sectional views taken along lines I-I' of corresponding plan views, respectively.

Figure 3:
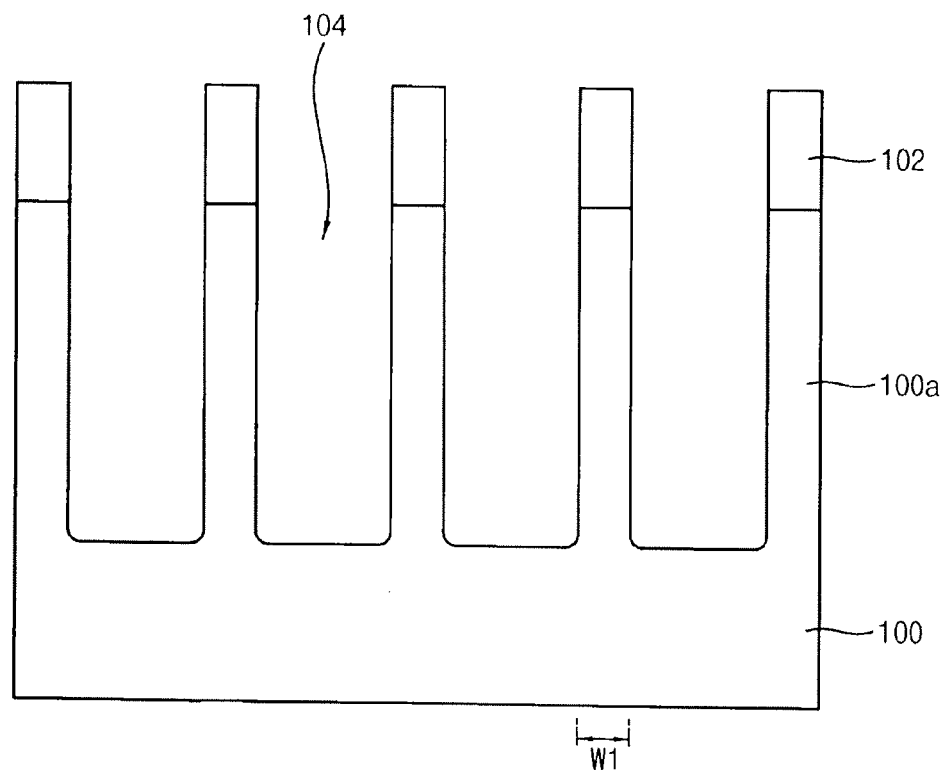
FIGS. 3 to 14 illustrate plan views and cross-sectional views of stages of a method of forming the active structure of the semiconductor device in FIGS. 1 and 2 in accordance with example embodiments.
Figure 4:
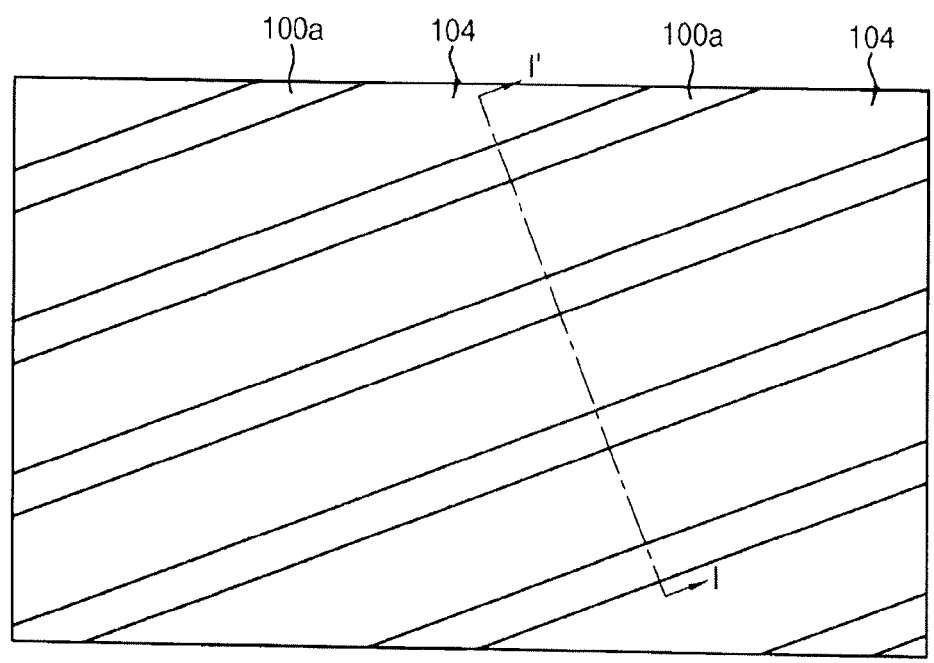

Referring to FIGS. 3 and 4, a hard mask 102 may be formed on a substrate 100.

In example embodiments, a plurality of hard masks 102 may be formed to cover portions of the substrate 100 for forming first preliminary active patterns 100a, and each of the hard masks 102 may have a first width W1 in the second direction, and may extend in the first direction. A distance between the hard masks 102 may be about 2 times to about 3 times of the first width W1. The first width W1 may be greater than a minimum size of a pattern formed by a photolithography process.

The hard masks 102 may include a material substantially the same as that of an insulating spacer 106 (refer to FIGS. 5 and 6) subsequently formed. The hard masks 102 may be formed to include an oxide, e.g., silicon oxide.

In example embodiments, the hard masks 102 may extend in a direction that may be neither parallel nor perpendicular to a flat zone or a notch of the substrate 100. In example embodiments, the hard masks 102 may extend in a direction that may be parallel or perpendicular to the flat zone or the notch of the substrate 100.

The substrate 100 may be etched using the hard masks 102 as an etching mask to form the first preliminary active patterns 100a. Each of the first preliminary active patterns 100a may have the first width W1 in the second direction, and may extend in the first direction. In example embodiments, each of the first preliminary active patterns 100a may have a high aspect ratio of about 10:1 to about 30:1.

A first trench 104 may be formed between the first preliminary active patterns 100a to extend in the first direction. A width of the first trench 104 in the second direction may be about 2 times to about 3 times of the first width W1.

Figure 5:
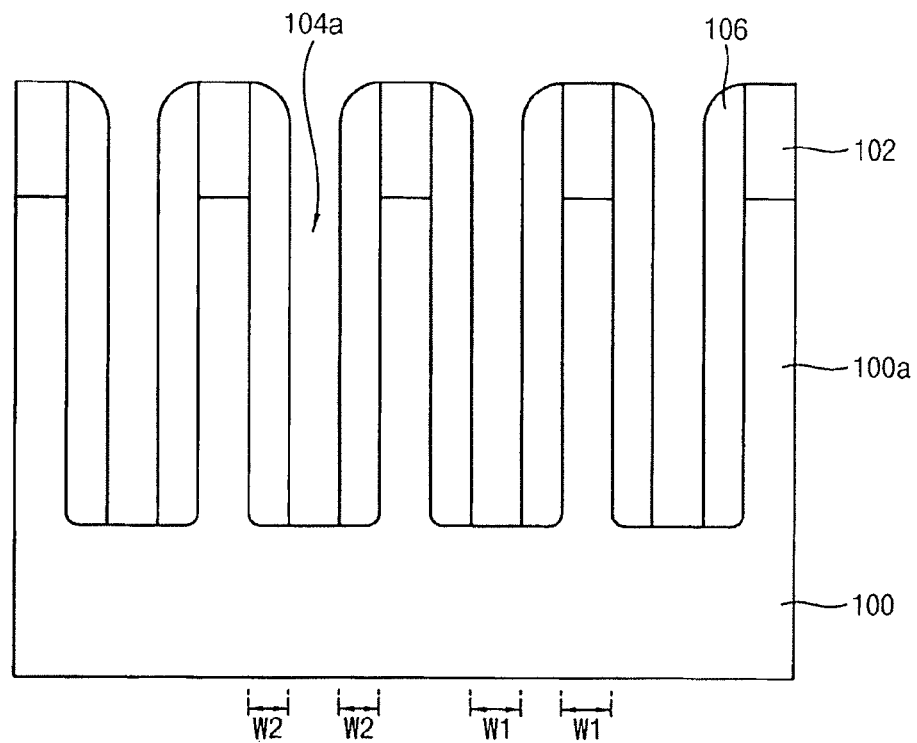
Figure 6:
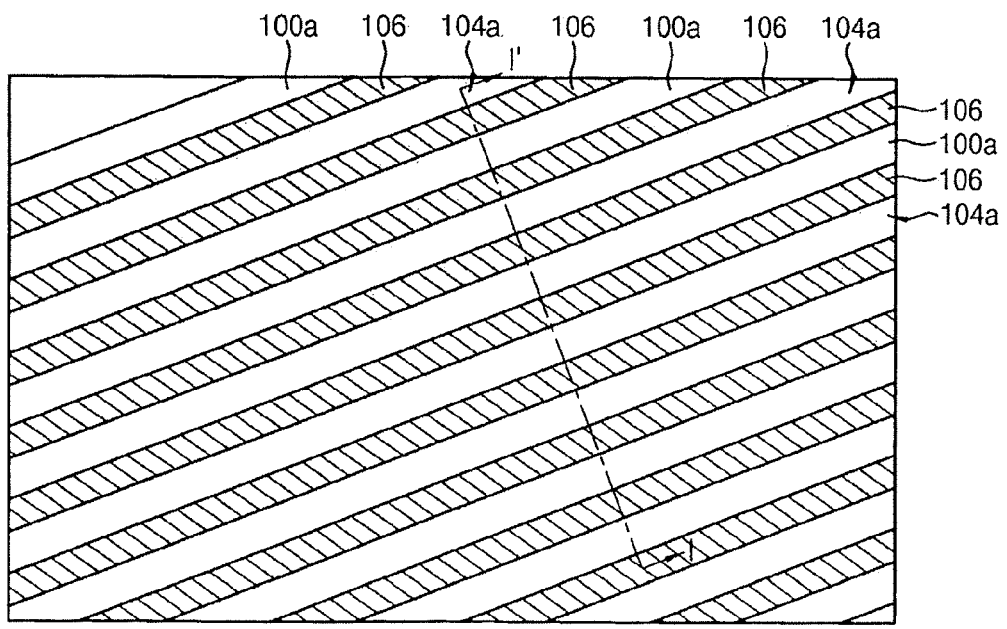

Referring to FIGS. 5 and 6, the first preliminary insulating spacer 106 having a second width W2 in the second direction may be formed on both sidewalls, e.g., on each sidewall, of the first trench 104 and the hard mask 102.

For example, an insulating spacer layer may be conformally formed on the first trench 104 and the hard mask 102, and the insulating spacer layer may be anisotropically etched to form the first preliminary insulating spacer 106 on the sidewalls of the first trench 104 and the hard mask 102.

According to the formation of the first preliminary insulating spacer 106, the first trench 104 may be transformed into a second trench 104a having a width smaller than that of the first trench 104. A portion of the substrate 100 may be exposed by the second trench 104a.

The insulating spacer layer may be formed to have a thickness smaller than the first width W1 so that the second trench 104a may have the first width W1. In example embodiments, the insulating spacer layer may be formed to have a thickness more than about 0.5 times of the first width W1, and active patterns 100a and subsequently formed active patterns 110 (refer to FIGS. 7 and 8) may be effectively isolated from each other. In example embodiments, the insulating spacer layer may be formed to have a thin thickness by an atomic layer deposition (ALD) process.

The first preliminary insulating spacer 106 may have the second width W2 that may be about 0.5 times to about 1 time of the first width W1. The first preliminary insulating spacer 106 may serve as a portion of an isolation layer pattern structure 126 (refer to FIGS. 13 and 14) by subsequent processes. The first preliminary insulating spacer 106 may be formed to include an oxide, e.g., silicon oxide.

The first preliminary insulating spacer 106 may not be formed to fill an opening having a small width, but may be formed to be deposited on the sidewalls of the first trench 104 having a relatively wide width, and generation of voids or seams may be decreased in the isolation layer pattern structure 126.

Figure 7:
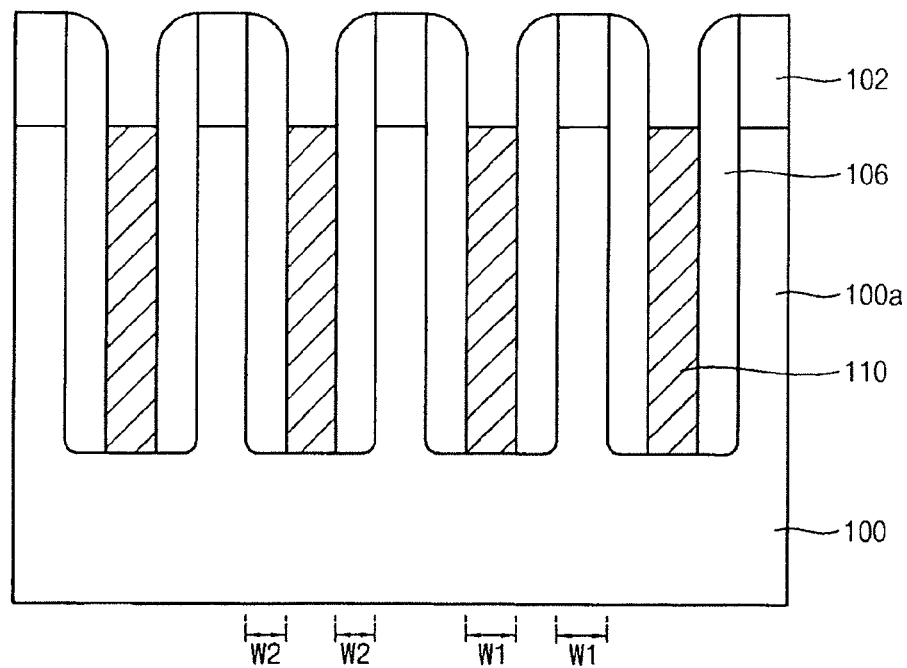
Figure 8:
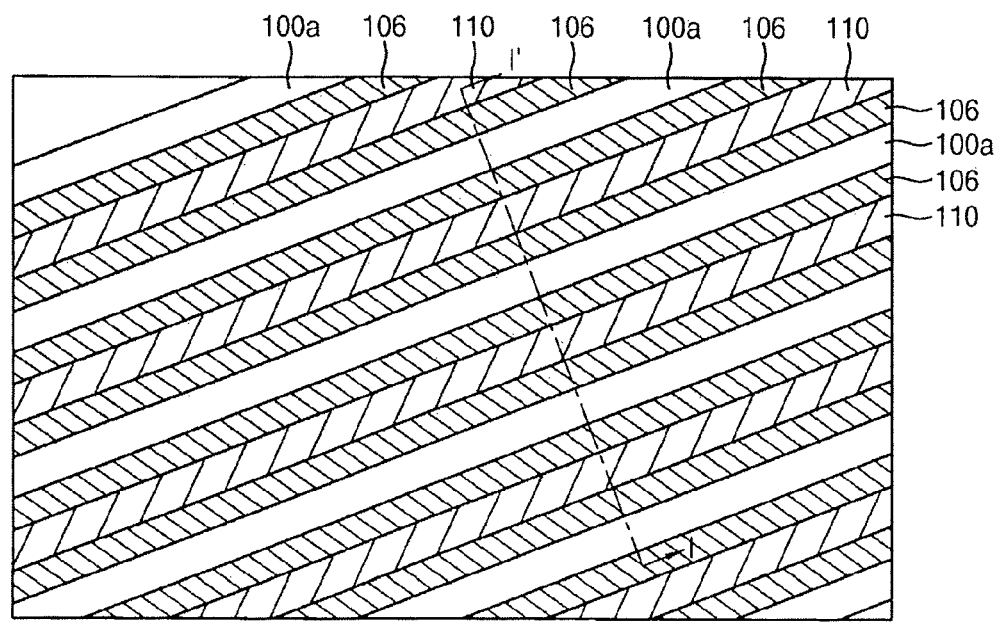

Referring to FIGS. 7 and 8, a second preliminary active pattern 110 may be formed to fill the second trench 104a.

In example embodiments, a selective epitaxial growth (SEG) process may be performed using a portion of the substrate 100 exposed by the second trench 104a as a seed to form the second preliminary active pattern 110. The second preliminary active pattern 110 may be formed to include a material substantially the same as that of the first preliminary active pattern 100a. The second preliminary active pattern 110 may be formed to have the first width W1 in the second direction, and the second preliminary active pattern 110 may have a width substantially the same as that of the first preliminary active pattern 100a.

A top surface of the second preliminary active pattern 110 may be formed to have a height substantially the same as that of a top surface of the first preliminary active pattern 100a, and each of the first and second preliminary active patterns 100a and 110 may have a high aspect ratio of about 10:1 to about 30:1.

Figure 9:
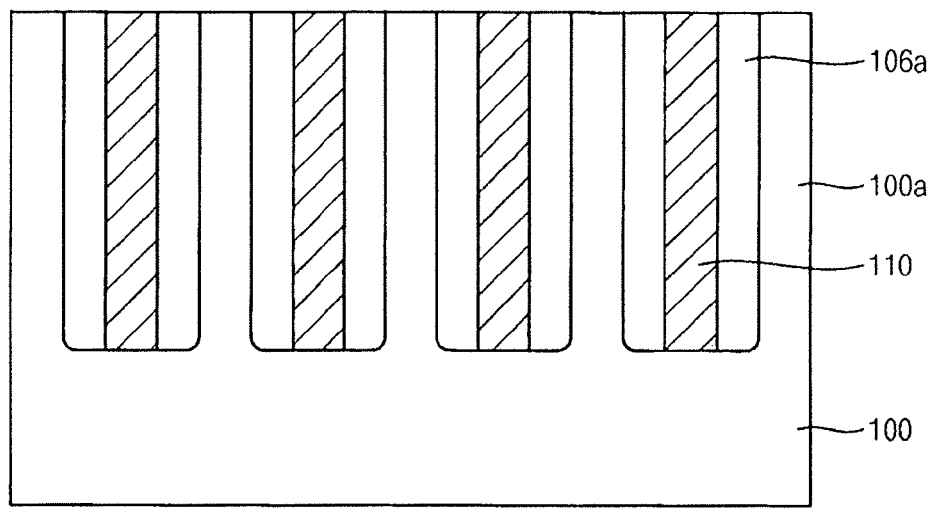
Figure 10:
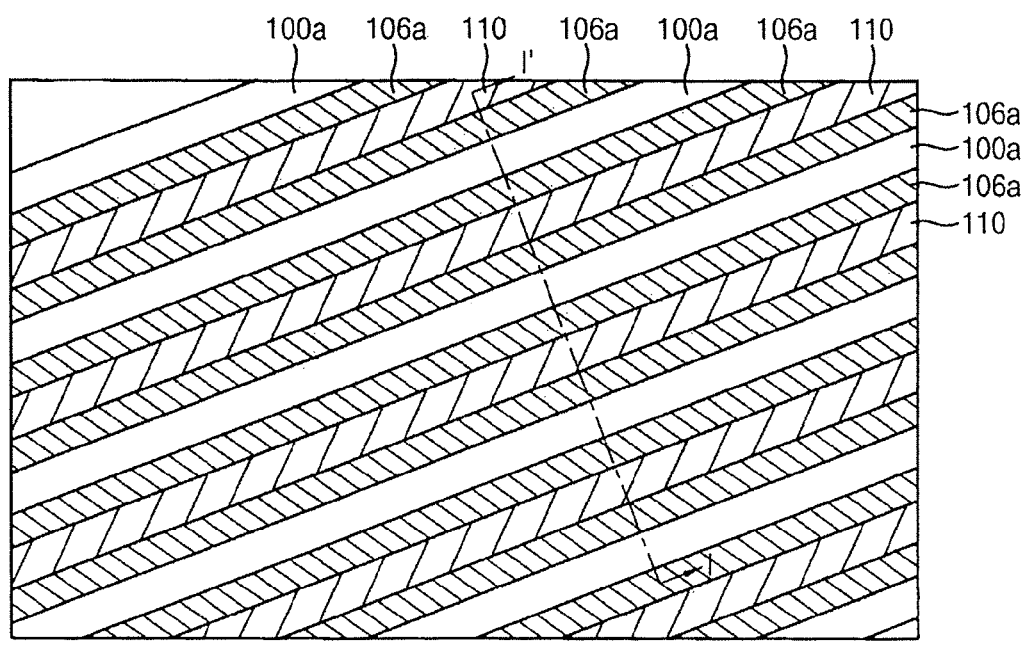

Referring to FIGS. 9 and 10, an upper portion of the first preliminary insulating spacer 106 above the top surface of the first preliminary active pattern 100a and the hard mask 102 may be etched. The hard mask 102 may be removed, and the first preliminary insulating spacer 106 may be partially removed to form an insulating spacer 106a.

The upper portion of the first preliminary insulating spacer 106 and the hard mask 102 may be removed by a wet etching process, and damage of, e.g., to, surfaces of the first and second preliminary active patterns 100a and 110 may decrease.

The hard mask 102 and the first preliminary insulating spacer 106 may include substantially the same material, and may be simultaneous removed by the wet etching process. In example embodiments, when the hard mask 102 and the first preliminary insulating spacer 106 may include silicon oxide, the hard mask 102 and the first preliminary insulating spacer 106 may be removed using hydrofluoric acid as an etchant.

In example embodiments, a plurality of first preliminary active patterns 100a and a plurality of second preliminary active patterns 110 may be alternately and repeatedly formed in the second direction. In example embodiments, the first preliminary active patterns 100a may be formed in odd-numbered rows, and the second preliminary active patterns 110 may be formed in even-numbered rows. The insulating spacer 106a may be formed between the first and second preliminary active patterns 100a and 110 disposed in the second direction.

In example embodiments, when the active structure may include lines and spaces alternately and repeatedly arranged in the second direction, subsequent processes may not be performed. The first and second preliminary active patterns 100a and 110 and the insulating spacer 106a may form the active structure in the semiconductor device.

Figure 11:
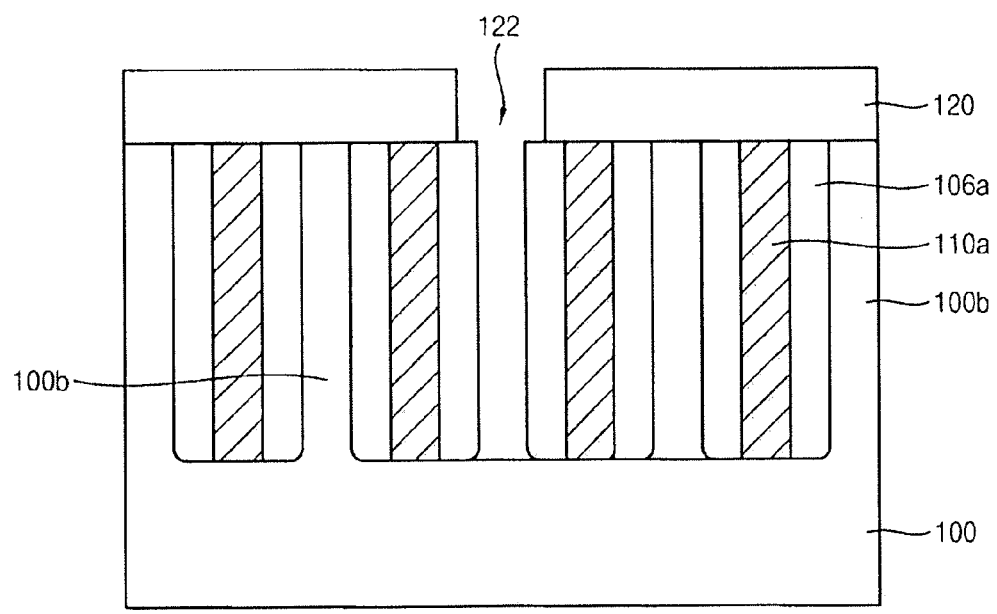
Figure 12:
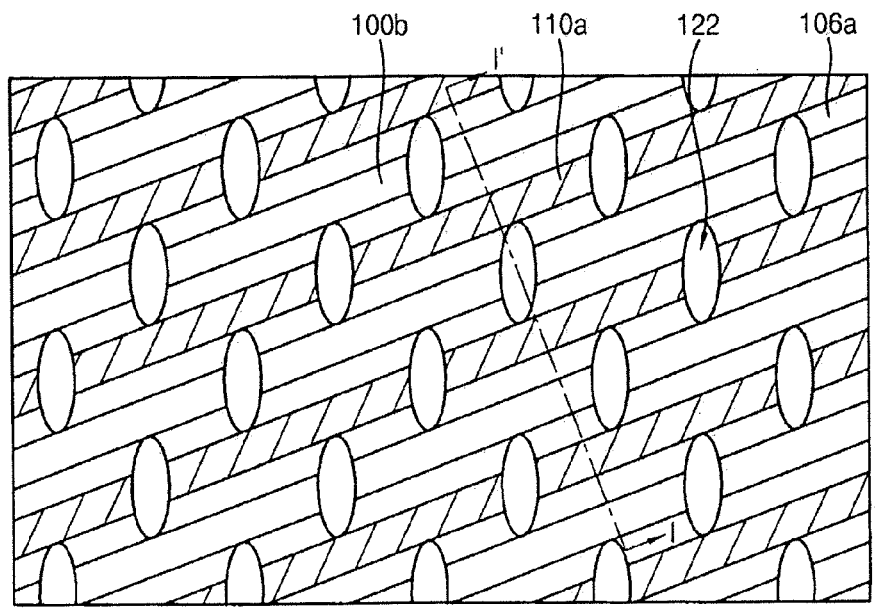

Referring to FIGS. 11 and 12, a mask 120 may be formed on the first and second preliminary active patterns 100a and 110 and the insulating spacer 106a to expose cutting portions of the first and second preliminary active patterns 100a and 110. The mask 120 may include holes overlapping the cutting portions of first and second preliminary active patterns 100a and 110. The mask 120 may include a photoresist pattern.

The first and second preliminary active patterns 100a and 110 may be etched using the mask 120 as an etching mask to form a plurality of first active patterns 100b disposed both in the first and second directions and a plurality of second active patterns 110a disposed both in the first and second directions, respectively, and first holes 122 may be formed between the plurality of first active patterns 100b and the plurality of second active patterns 110a.

Figure 13:
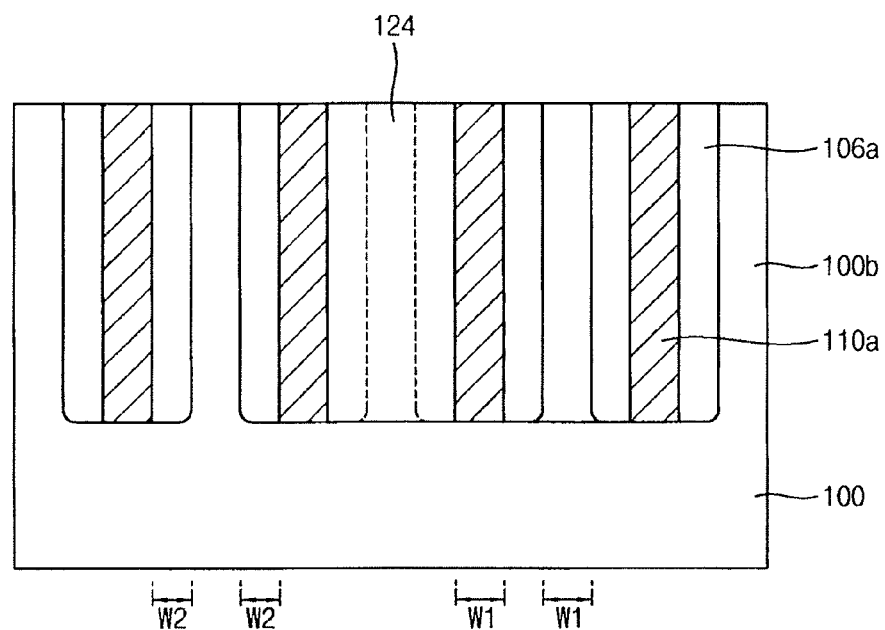
Figure 14:
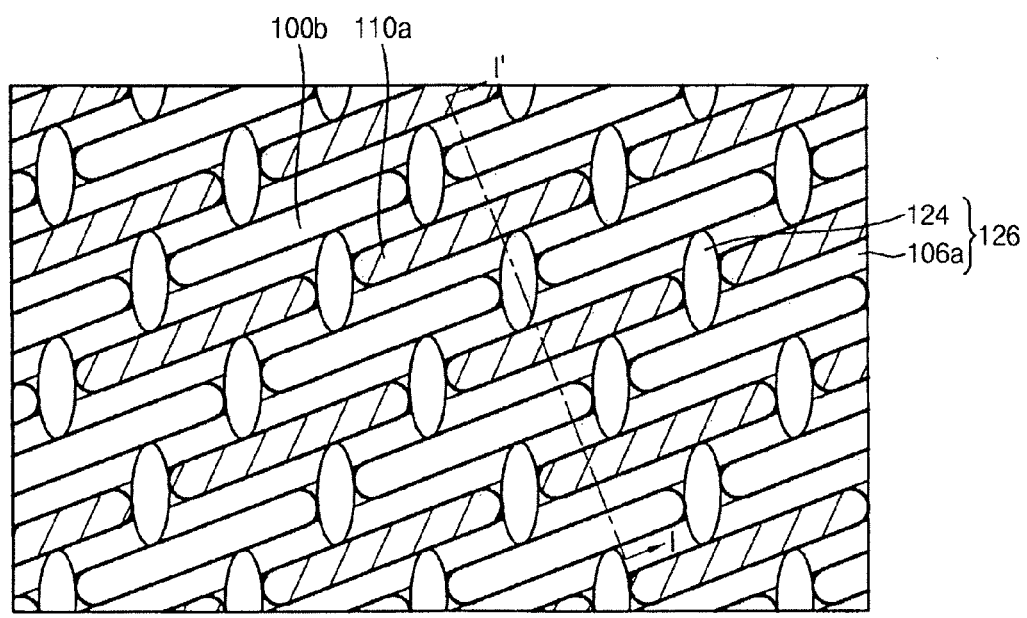

Referring to FIGS. 13 and 14, an insulation pattern 124 may be formed to fill each of the first holes 122.

In example embodiments, a first insulation layer may be formed on the first and second active patterns 100b and 110a and the insulating spacer 106a to sufficiently fill the first holes 122. The first insulation layer may be formed to include an oxide, e.g., silicon oxide or a nitride, e.g., silicon nitride. In example embodiments, the first insulation layer may include a material substantially the same as that of the insulating spacer 106a. An upper portion of the first insulation layer may be planarized until the top surfaces of the first and second active patterns 100b and 110a may be exposed to form the insulation pattern 124. In example embodiments, the planarization process may be performed by a chemical mechanical polishing (CMP) process and/or an etch back process. The insulation pattern 124 may have a pillar shape.

The isolation layer pattern structure 126 including the insulating spacer 106a and the insulation pattern 124 may be formed.

Each of the first and second active patterns 100b and 110a may have the first width W1, and the insulating spacer 106a may have the second width W2 smaller than the first width W1. According as the second width W2 of the insulating spacer 106a decreases, top areas of the first and second active patterns 100b and 110a may increase. When the insulating spacer 106a is formed, generation of voids or seams in the insulating spacer 106a may decrease, and the first and second active patterns 100b and 110a may be formed to have a high aspect ratio of about 10:1 to about 30:1.

As described above, the active structure of the semiconductor device may be formed.

Figure 15:
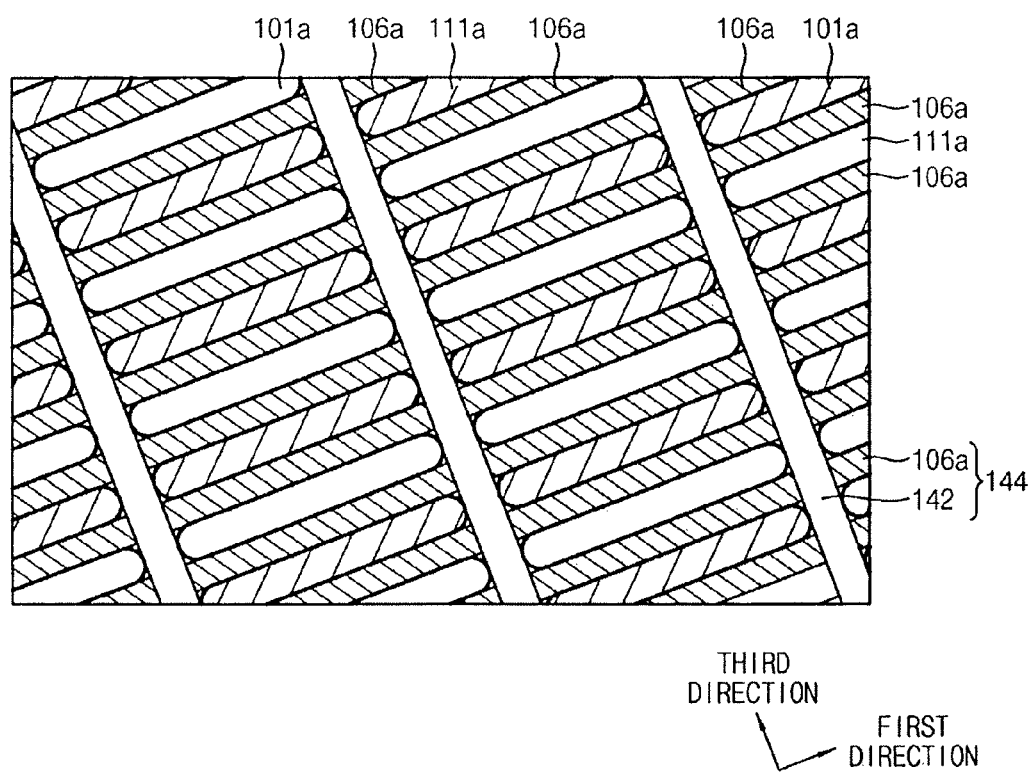
FIG. 15 illustrates a plan view of an active structure of a semiconductor device in accordance with example embodiments.

FIG. 15 illustrates a plan view of an active structure of a semiconductor device in accordance with example embodiments.

The active structure of the semiconductor device may be substantially the same as or similar to that illustrated in FIGS. 1 and 2, except for positions and shapes of elements of the active structure.

Referring to FIG. 15, the active structure of the semiconductor device may include first and second active patterns 101a and 111a protruding from a top surface of a substrate 100, and an isolation layer pattern structure 144 between the first and second active patterns 101a and 111a.

The isolation layer pattern structure 144 may include an insulating spacer 106a and an insulation pattern 142. The an insulating spacer 106a may be formed on sidewalls of the first and second active patterns 101a and 111a, and may extend in the first direction. The insulation pattern 142 may be formed at a first area between neighboring first active patterns 101a in the first direction and a second area between neighboring second active patterns 111a in the first direction. The insulation pattern 142 may extend in a third direction different from the first direction, and the first and second active patterns 101a and 111a may be alternately and repeatedly arranged in the third direction.

Figure 16:
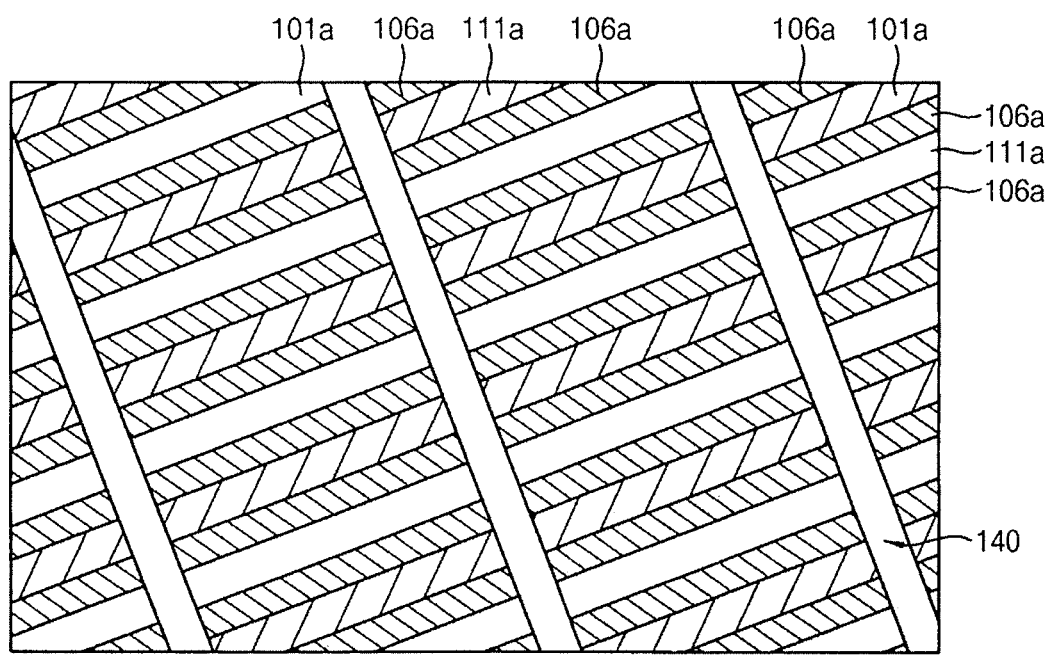
FIG. 16 illustrates a plan view of a stage of a method of forming the active structure of the semiconductor device in FIG. 15 in accordance with example embodiments.

FIG. 16 illustrates a plan view of a stage of a method of forming the active structure of the semiconductor device in FIG. 15 in accordance with example embodiments.

Referring to FIG. 16, processes substantially the same as or similar to those illustrated with reference to FIGS. 5 to 14 may be performed.

An etching mask may be formed on the first and second preliminary active patterns 100a and 110 and the insulating spacer 106a to expose cutting portions of the first and second preliminary active patterns 100a and 110. The mask may include a photoresist pattern. The exposed cutting portions of the first and second preliminary active patterns 100a and 110 may extend in the third direction.

The first and second preliminary active patterns 100a and 110 and the insulating spacer 106a may be etched using the etching mask to form first and second active patterns 101a and 111a, and an opening extending in the third direction.

Referring to FIG. 15 again, an insulation pattern 142 may be formed to fill the opening. The insulation pattern 142 may extend in the third direction.

As described above, the active structure of the semiconductor device may be formed.

Figure 17:
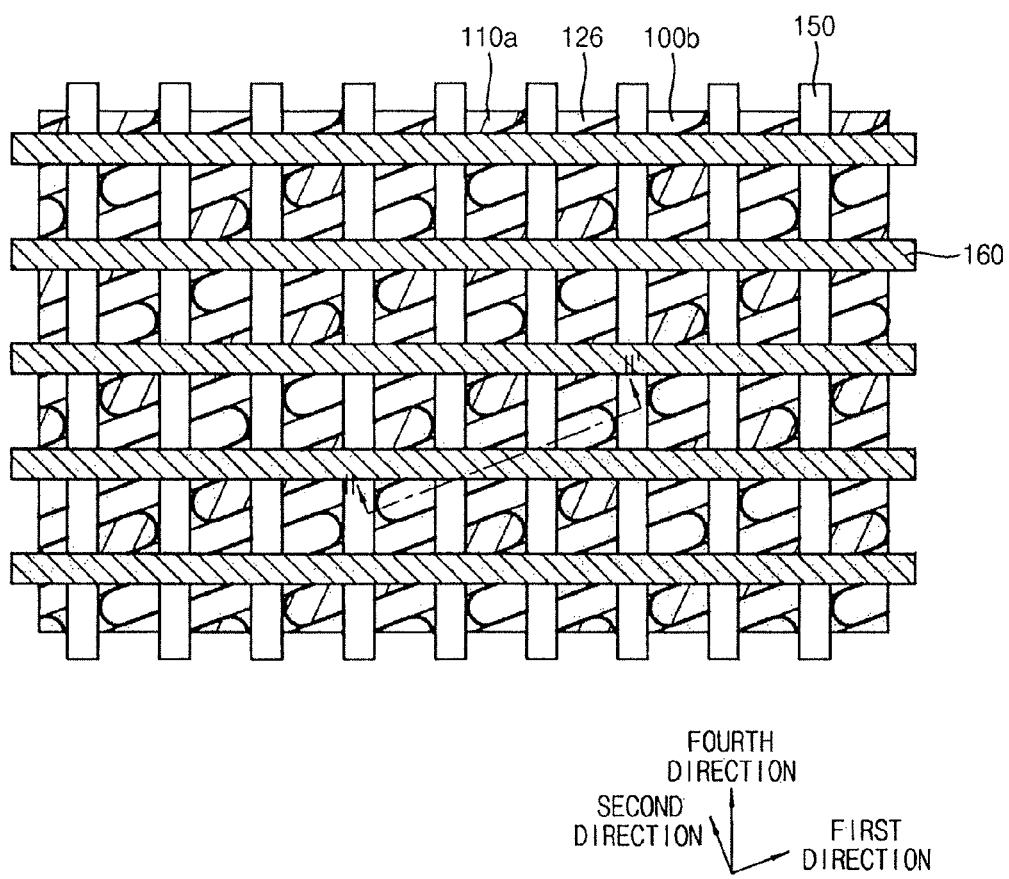
FIGS. 17 and 18 illustrate a plan view and a cross-sectional view, respectively, of a semiconductor device on an active structure in accordance with example embodiments.
Figure 18:
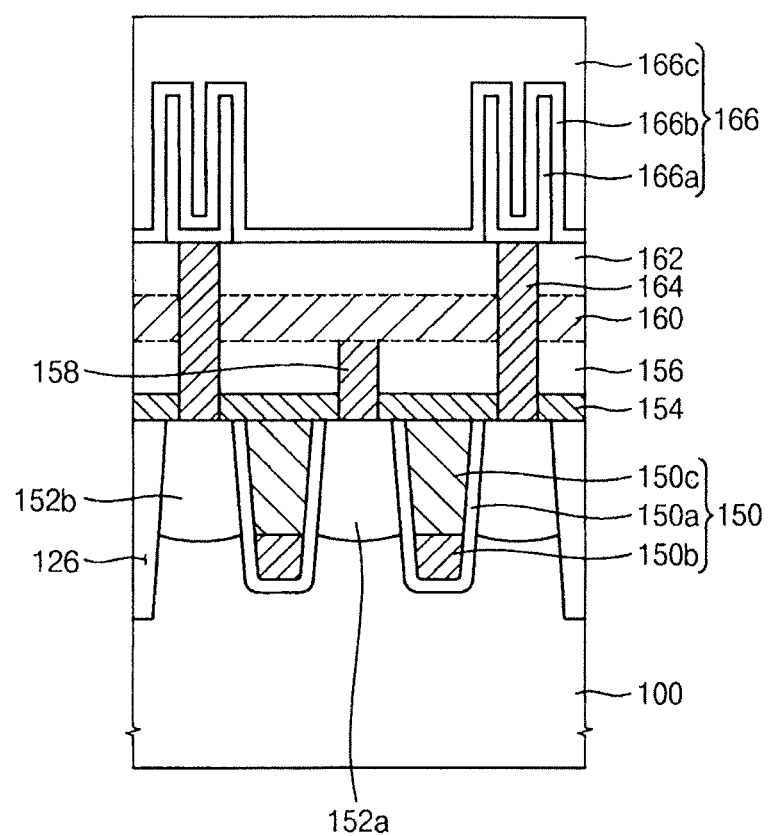

FIGS. 17 and 18 illustrate a plan view and a cross-sectional view, respectively, of a semiconductor device on an active structure in accordance with example embodiments. FIG. 18 illustrates the cross-sectional view taken along a line II-II' of FIG. 17.

The semiconductor device may be a DRAM device on the active structure illustrated in FIGS. 1 and 2. In FIG. 17, capacitors and contact plugs are omitted for the convenience of explanation.

Referring to FIGS. 17 and 18, the semiconductor device may include first and second active patterns 100b and 110a protruding from a top surface of a substrate 100, and an isolation layer pattern structure 126 between the first and second active patterns 100b and 110a. The semiconductor device may include a buried gate structure 150, first and second impurity regions 152a and 152b, first and second contact plugs 158 and 164, a bit line 160 and a capacitor 166 on the substrate 100.

The first and second active patterns 100b and 110a and isolation layer pattern structure 126 may be substantially the same as or similar to those illustrated in FIGS. 1 and 2. A buried transistor may be formed on the first and second active patterns 100b and 110a and isolation layer pattern structure 126 to include the buried gate structure 150, and the first and second impurity regions 152a and 152b.

For example, a gate trench may be formed on an upper portion of the first and second active patterns 100b and 110a and the isolation layer pattern structure 126 to extend a fourth direction different from the first direction. In example embodiments, the fourth direction may have an acute angle with the first direction. In example embodiments, the fourth direction may be substantially perpendicular to the first direction. A bottom of the gate trench may be higher than that of the isolation layer pattern structure 126.

The buried gate structure 150 may fill the gate trench. The buried gate structure 160 may include a gate insulation pattern 150a, a gate electrode 150b and a capping layer pattern 150c sequentially stacked.

The gate insulation pattern 150a may be formed on an inner wall of the gate trench to have a hollow cylindrical shape. The gate insulation pattern 150a may be formed by a thermal oxidation on exposed portions of the substrate 100, e.g., sidewalls of the first and second active patterns 100b and 110a and the exposed portion of the substrate 100 by the bottom of the gate trench. The gate insulation pattern 150a may include a thermal oxide, which may have interface characteristics better than those of an oxide formed by a chemical vapor deposition (CVD) process and/or an atomic layer deposition (ALD) process, and the gate insulation pattern 150a including the thermal oxide may have improved electrical characteristics.

The gate electrode 150b may be formed on the gate insulation pattern 150a to partially fill the gate trench. The gate electrode 150b may include a metal. In example embodiments, the gate electrode 150b may include a metal layer and a barrier layer covering a sidewall and a bottom of the metal layer. For example, the gate electrode 150b may include a tungsten layer serving as the metal layer and a tungsten nitride layer serving as the barrier layer. In example embodiments, the gate electrode 150b may include polysilicon.

The capping layer pattern 150c may be formed on the gate electrode 150b to fill a remaining portion of the gate trench. The capping layer pattern 150c may include a nitride, e.g., silicon nitride.

The first and second impurity regions 152a and 152b may be formed at upper portions of the first and second active patterns 100b and 110a adjacent to both sidewalls of the buried gate structure 150. The first and second impurity regions 152a and 152b may serve as source/drain regions of the buried transistor.

In example embodiments, an etch stop layer 154 and a first insulating interlayer 156 may be sequentially formed on the buried gate structure 150, the first and second active patterns 100b and 110a and the isolation layer pattern structure 126. The etch stop layer 154 may include a nitride, e.g., silicon nitride, and the first insulating interlayer may 156 include an oxide, e.g., silicon oxide.

The first contact plug 158 may contact the first impurity region 152a through the first insulating interlayer 156 and the etch stop layer 154.

The bit line 160 may be formed on the first insulating interlayer 156, and may extend in a direction substantially perpendicular to the fourth direction. The bit line 160 may extend to the direction substantially perpendicular to an extension direction of the buried gate structure 150. The bit line 160 may contact an upper surface of the first contact plug 158. A hard mask may be further formed on the bit line 160. Spacers may be further formed on sidewalls of the bit line 160 and the hard mask sequentially stacked.

A second insulating interlayer 162 may be formed on the first insulating interlayer 156, and may cover the bit line 160.

The second contact plug 164 may contact the second impurity region 152b through the second and first insulating interlayers 162 and 156 and the etch stop layer 154. The second contact plug 164 may not be electrically connected to the bit line 160.

A minimum width of each of the first and second active patterns 100b and 110a in a plan view may be greater than a minimum size of a pattern formed by a photolithography process. Top surfaces of the first and second active patterns 100b and 110a may increase, so that resistances of the first and second contact plugs 154 and 168 contacting the first and second active patterns 100b and 110a may decrease.

The capacitor 166 may be formed on the second contact plug 164. The capacitor 166 may include a lower electrode 166a, a dielectric layer 166b and an upper electrode 166c sequentially stacked.

As described above, the buried transistor may include the gate insulation pattern 150a including thermal oxide. According as the top surfaces of the first and second active patterns 100b and 110a may increase, resistances of the first and second contact plugs 154 and 168 may decrease. Generation of voids or seams in the isolation layer pattern structure 126 may decrease, and an electrical short between neighboring buried transistors, for example, due to the voids or seams, may decrease.

Figure 19:
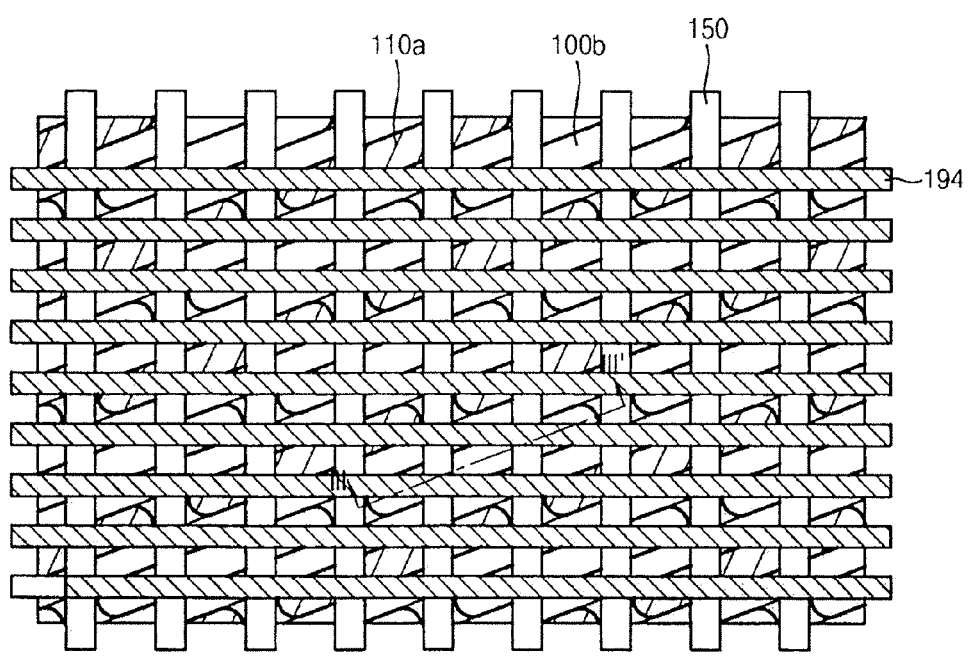
FIGS. 19 and 20 illustrate a plan view and a cross-sectional view, respectively, of a semiconductor device on an active structure in accordance with example embodiments.
Figure 19:
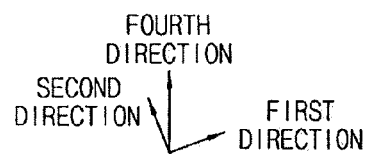
Figure 20:
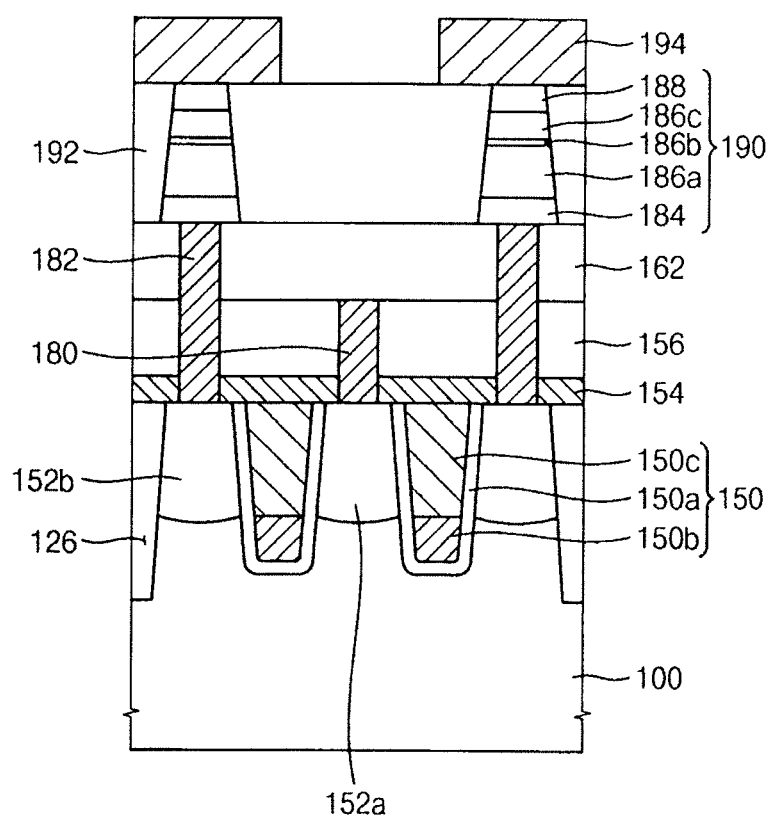

FIGS. 19 and 20 illustrate a plan view and a cross-sectional view, respectively, of a semiconductor device on an active structure in accordance with example embodiments. FIG. 20 illustrates the cross-sectional view taken along a line III-III' of FIG. 19.

The semiconductor device may be a variable resistance memory device on the active structure illustrated in FIGS. 1 and 2. In FIG. 19, source lines are omitted for the convenience of explanation.

Referring to FIGS. 19 and 20, the semiconductor device may include first and second active patterns 100b and 110a protruding from a top surface of a substrate 100, and an isolation layer pattern structure 126 between the first and second active patterns 100b and 110a. The semiconductor device may further include a buried gate structure 150, first and second impurity regions 152a and 152b, a source line 180, a contact plug 182, a variable resistance structure 184 and a capacitor 190 on the substrate 100.

A buried transistor may be formed on the first and second active patterns 100b and 110a and isolation layer pattern structure 126 to include the buried gate structure 150 and the first and second impurity regions 152a and 152b. The buried transistor may be substantially the same as or similar to that illustrated with reference to FIGS. 17 and 18.

In example embodiments, an etch stop layer 154 and a first insulating interlayer 156 may be sequentially formed on the buried structure 150, the first and second active patterns and the isolation layer pattern structure 126. The etch stop layer 154 may include a nitride, e.g., silicon nitride, and the first insulating interlayer 156 may include an oxide, e.g., silicon oxide.

The source line 180 may be formed through the first insulating interlayer 156 and the etch stop layer 154. The source line 180 may extend in a direction, and may contact the first impurity region 152a. The source line 180 may include a metal.

A second insulating interlayer 162 may be formed on the first insulating interlayer 156 and the source line 180.

The contact plug 182 may contact the second impurity region 152b through the second and first insulating interlayers 162 and 156 and the etch stop layer 154. The second contact plug 182 may include a metal.

The variable resistance structure 190 may be formed on the contact plug 182. In example embodiments, a plurality of variable resistance structures 190 may be formed to have an island shape from each other. The variable resistance structure 190 may include a lower electrode 184, a variable resistance pattern and an upper electrode 188 sequentially stacked.

In example embodiments, when the variable resistance memory device is a magnetoresistive random access memory (MRAM), the variable resistance pattern may include a material of which a resistance may be changed by a magnetic field or a spin transfer torque (STT). The variable resistance pattern may include a magnetic tunnel junction (MTJ) structure having a pin layer pattern 186a, a tunnel barrier layer pattern 186b and a free layer pattern 186c sequentially stacked.

In example embodiments, the variable resistance pattern may include a material of which a resistance may be changed by an oxygen vacancy or oxygen migration. The variable resistance memory device may be a ReRAM device.

In example embodiments, the variable resistance memory device may be a PRAM device, and the variable resistance pattern may include a material of which a resistance may be changed by a phase change or a phase transition. The variable resistance pattern may include a chalcogenide-based material including germanium (Ge), antimony (Sb), and/or tellurium (Te).

A third insulating interlayer 192 may be formed to fill a space between the variable resistance structures 190.

The bit line 194 may be formed on the third insulating interlayer 192 and the variable resistance structure 190. The bit line 194 may extend in a direction substantially perpendicular to the fourth direction. The bit line 194 may include a metal layer and a barrier layer covering a sidewall and a bottom of the metal layer.

As described above, the buried transistor may include the gate insulation pattern 150a including thermal oxide. According as top surfaces of the first and second active patterns 100b and 110a may increase, resistances between the first and second active patterns 100b and 110a and the contact plugs 182 may decrease. Generation of voids or seams in the isolation layer pattern structure may decrease, and an electrical short between neighboring buried transistors, for example, due to the voids or seams, may decrease.

The above semiconductor device may be applied to various types of systems, e.g., computing system.

Figure 21:
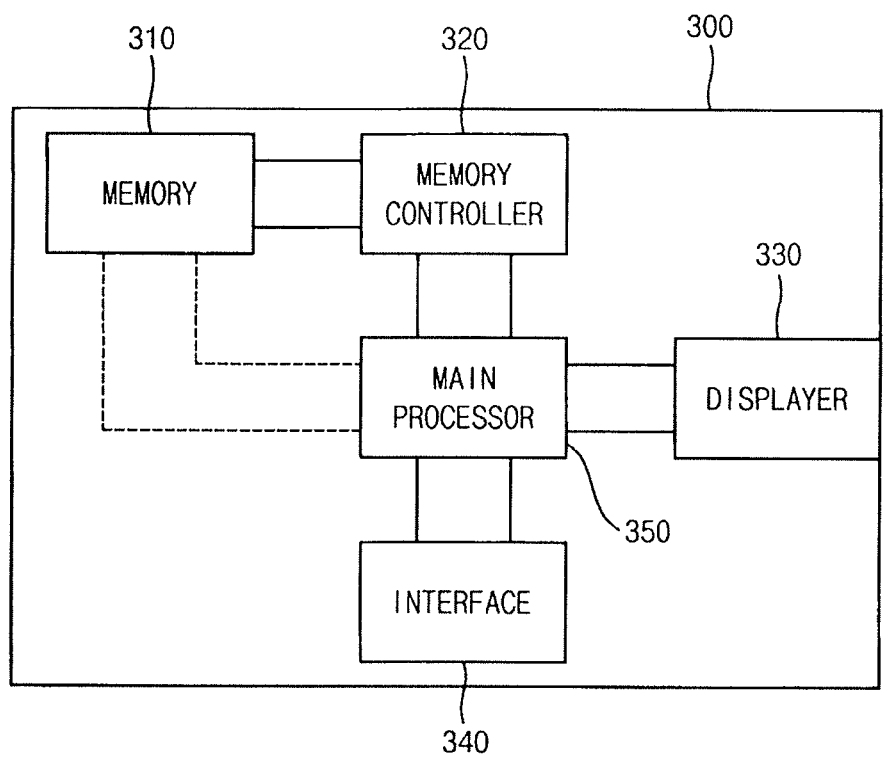
FIG. 21 illustrates a block diagram of a system in accordance with example embodiments.

FIG. 21 illustrates a block diagram of a system in accordance with example embodiments.

Referring to FIG. 21, a system 300 may include a memory device 310, a memory controller 320 for controlling operations of the memory device 310, a displayer 330 for outputting data, an interface 340 for receiving data, and a main processor 350 for controlling elements in the system 300.

The memory device 310 may include a semiconductor device formed on the active structure in accordance with example embodiments. The memory device 310 may be directly connected to the main processor 350. In example embodiments, the memory device 310 may be electrically connected to the main processor 350 via a bus. The system 300 may be applied to, e.g., a computer, a portable computer, a laptop computer, a personal digital assistant, a tablet personal computer, a mobile phone, or a digital music player.

By way of summation and review, in a highly integrated semiconductor device, a width of an active region may be decreased and a density thereof may be increased, and an aspect ratio of an active pattern serving as the active region may be increased. Voids or seams in an isolation layer between active patterns may be generated.

According to example embodiments, a substrate may be etched to form first active patterns, and then insulating spacers may be formed on sidewalls of the first active patterns. Second active patterns may be formed on the substrate between the insulating spacers by an epitaxial growth process, and voids or seams in the insulating spacers serving as isolation layers may be decreased. Each of the first and second active patterns may have a first width greater than a minimum size of a pattern formed by a photolithography process, and each of the insulation spacers may have a width smaller than the first width, and top surfaces of the first and second active patterns may be increased.

Example embodiments relate to linear type active structures of a semiconductor device and methods of manufacturing the same.

Example embodiments may provide a method of forming an active structure including a plurality of active patterns having minute widths spaced apart from each other at minute distances. Example embodiments may provide an active structure including a plurality of active patterns having minute widths spaced apart from each other at minute distances.

According to example embodiments, the active structure may be formed to include a first active pattern formed from an initial substrate, a second active pattern formed by the epitaxial growth process, and isolation layer pattern structure. Generation of voids or seams may be reduced in the isolation layer pattern structure. Top surfaces of the first and second active patterns may increase, and a highly integrated the semiconductor device may be formed on the active structure.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming patterns of a semiconductor device, comprising:
   partially etching an upper portion of a substrate to form first preliminary active patterns and a first trench, each of the first preliminary active patterns extending in a first direction and having a first width, and the first trench being formed between the first preliminary active patterns and having a second width of about 2 times to about 3 times the first width;
   forming an insulating spacer on each sidewall of the first trench to form a second trench having the first width;
   performing a selective epitaxial growth (SEG) process using a portion of the substrate exposed by the second trench as a seed to form a second preliminary active pattern in the second trench, the second preliminary active pattern having the first width;
   partially etching the first and second preliminary active patterns to form a plurality of first active patterns and a plurality of second active patterns, respectively, and an opening between the plurality of first active patterns and the plurality of second active patterns; and
   forming an insulation pattern to fill the opening.

2. The method as claimed in claim 1, further comprising forming a hard mask as an etching mask for forming the first trench on the substrate.

3. The method as claimed in claim 2, wherein the hard mask includes a substantially same insulation material as that of the insulating spacers.

4. The method as claimed in claim 2, wherein the hard mask and the insulating spacers include silicon oxide.

5. The method as claimed in claim 2, further comprising, after forming the second preliminary active pattern, removing upper portions of the insulating spacers and the hard mask above a top surface of the first preliminary active patterns.

6. The method as claimed in claim 5, wherein removing the upper portions of the insulating spacers and the hard mask includes a wet etch process.

7. The method as claimed in claim 1, wherein the second preliminary active pattern has a top surface substantially coplanar with that of the first preliminary active patterns.

8. The method as claimed in claim 1, wherein the first width is greater than a minimum size of a pattern formed by a photolithography process.

9. The method as claimed in claim 1, wherein forming the insulating spacer on each sidewall of the first trench to form the second trench includes:
   forming an insulating spacer layer on each sidewall of the first trench by an atomic layer deposition (ALD) process to form the second trench; and
   anisotropically etching the insulating spacer layer.

10. The method as claimed in claim 1, wherein the opening extends in a direction different from the first direction.

11. The method as claimed in claim 1, wherein partially etching the first and second preliminary active patterns to form the plurality of first active patterns and the plurality of second active patterns, respectively, and the opening includes forming a plurality of openings isolated from each other.

12. The method as claimed in claim 1, wherein the second preliminary active pattern includes a substantially same semiconductor material as that of the first preliminary active patterns.

13. A method of forming patterns of a semiconductor device, comprising:
   forming first preliminary active patterns and a first trench, each of the first preliminary active patterns extending in a first direction, and the first trench being formed between the first preliminary active patterns;
   forming an insulating spacer on each sidewall of the first trench to form a second trench;
   forming a second preliminary active pattern in the second trench;
   forming first active patterns and second active patterns, respectively, and an opening between the first active patterns and the second active patterns, each of the first and second active patterns having a first width greater than a minimum size of a pattern formed by a photolithography process, and each of the insulating spacers having a width smaller than the first width; and
   forming an insulation pattern to fill the opening.

14. The method as claimed in claim 13, further comprising forming a hard mask as an etching mask for forming the first trench.

15. The method as claimed in claim 14, further comprising, after forming the second preliminary active pattern, removing upper portions of the insulating spacers and the hard mask above a top surface of the first preliminary active patterns, wherein removing the upper portions of the insulating spacers and the hard mask includes a wet etch process.

16. The method as claimed in claim 13, wherein each of the insulating spacers has a width of about 0.5 times to less than 1 time the first width.

17. The method as claimed in claim 13, wherein each of the first and second preliminary active patterns has an aspect ratio of about 10:1 to about 30:1.

* * * * *